United States Patent [19]
Dynes et al.

[11] Patent Number: 4,816,421
[45] Date of Patent: Mar. 28, 1989

[54] METHOD OF MAKING A HETEROEPITAXIAL STRUCTURE BY MESOTAXY INDUCED BY BURIED IMPLANTATION

[75] Inventors: Robert C. Dynes, Summit; Kenneth T. Short; Alice E. White, both of New Providence, all of N.J.

[73] Assignee: American Telephone and Telegraph Company, AT&T Bell Laboratories, Murray Hill, N.J.

[21] Appl. No.: 934,160

[22] Filed: Nov. 24, 1986

[51] Int. Cl.$^4$ .................... H01L 21/265; H01L 21/28
[52] U.S. Cl. ........................... 437/26; 357/67; 437/20; 437/25; 437/38; 437/200
[58] Field of Search ................. 437/20, 25, 26, 38, 437/200; 357/67

[56] References Cited

U.S. PATENT DOCUMENTS 3,855,009 12/1974 Lloyd et al. .
4,554,045 11/1985 Bean et al. .
4,577,396 3/1986 Yamamoto et al. ............... 29/576 B

FOREIGN PATENT DOCUMENTS 0150419 8/1984 Japan .......................... 148/DIG. 83

OTHER PUBLICATIONS

Namavar et al., Mat. Res. Soc. Symp. Proc. 27 (1984) p. 341.
Hung et al., Jour. Appl. Phys. 58 (1985) 1527.
Appelbaum et al., Jour. Appl. Phys. 57 (1985) 1880.
Tung et al., J. Vac. Sci. Technol. 3A (1985) 987.
Campisi et al., in Mat. Res. Soc. Symp. Proc., vol. 54, 1986, pp. 747–752.
Ishiwara et al., Jap. Jour. Appl. Phys. 20 (1981) 843.
"Silicon/Insulator Heteroepitaxial Structures Formed by Vacuum Deposition of CaF$_2$ and Si", *Applied Physics Letters*, vol. 40, No. 1, 1982, pp. 66–68, H. Ishiwara, et al.
"Electron-Beam Annealing of Co and Cr Implanted Polycrystalline Silicon", *Institute of Physics Conference Series*, No. 67, Section 3, 1983, pp. 137–142, M. N. Kozicki, et al.
"Silicide Formation by High Dose Transition Metal Implants into Si", *Proceedings of the Materials Research Society Symposium*, vol. 51, 1986, pp. 439–444, F. H. Sanchez, et al.
Integrated Circuit Fabrication Technology, 1982, David J. Elliot, McGraw-Hill, Inc.
"Limits of Composition Achievable by Ion Implantation", *Journal of Vacuum Science and Technology*, vol. 15, 1978, pp. 1629–1635, Z. L. Liau, et al.

Primary Examiner—Upendra Roy
Attorney, Agent, or Firm—Eugen E. Pacher

[57] ABSTRACT

Disclosed is a technique, termed "mesotaxy", for producing a heteroepitaxial structure comprising a layer of single crystal second material embedded in, and epitaxial with, a single crystal first material matrix. Mesotaxy comprises implantation of at least one chemical species (e.g., Co, Ni, Cr, Y or Mg) into a single crystal body (typically a semiconductor, e.g., Si or Ge) such that a buried layer rich in the implanted species is formed, and heat treating the implanted body such that a buried stoichiometric compound layer (e.g., CoSi$_2$) is formed. Exemplarily, $3 \cdot 10^{17}/cm^2$ 200 keV Co ions are implanted into (100) Si nominally at 350° C., followed by a heat treatment that consists of 1 hour at 600° C. and 30 minutes at 1000° C. The resulting buried CoSi$_2$ layer is epitaxial with the Si matrix, has high conductivity and is of good crystalline quality. The Si overlayer is of device quality. The thus produced heteroepitaxial structure can then be used to produce semiconductor devices, e.g., MOSFETs with a buried ground plane.

11 Claims, 2 Drawing Sheets

METHOD OF MAKING A HETEROEPITAXIAL STRUCTURE BY MESOTAXY INDUCED BY BURIED IMPLANTATION

FIELD OF THE INVENTION

This invention pertains to methods for forming heteroepitaxial structures, and to semiconductor devices and other articles incorporating such structures.

BACKGROUND OF THE INVENTION

From the beginning of semiconductor device technology physicists have postulated a host of heterostructures, i.e., combinations of layers of different materials in a single composite crystal. The interest in this kind of structure is traceable to the wide variety of characteristics that can potentially be achieved in devices incorporating such structures.

In the last few years, considerable progress has been made in this field, and techniques are now known that permit production of various combinations of materials. For instance, U.s. Pat. No. 4,554,045 (incorporated herein by reference) teaches a method for producing metal silicide/silicon heterostructures, such that the silicide is essentially monocrystalline and epitaxial with the underlying silicon substrate.

The known techniques are not restricted to techniques for forming heterostructures comprising a metal silicide layer. For instance, Ishiwara et al, *Applied Physics Letters,* Vol. 40, pages 66–68 (1982), disclose a technique for growing an epitaxial dielectric layer, namely $CaF_2$, on silicon.

All of the prior art techniques for growing a heteroepitaxial structure have in common that they involve deposition of material onto the surface of the single crystal substrate. Obviously, once the epitaxial single crystal overlayer is formed it can become the substrate for formation of a further heteroepitaxial layer. Thus, the prior art knows $Si/CoSi_2/Si$ and $Si/CaF_2/Si$ heterostructures formed by particular embodiments of the deposition technique.

The prior art also knows several techniques for forming a particular heterostructure, namely, $Si/SiO_2/Si$ (also referred to as SOI). Structurally, SOI differs fundamentally from the above referred to heterostructures since the $SiO_2$ layer is not a single crystal layer, and, in fact, typically is amorphous. Thus SOI structures are not heteroepitaxial structures in the way the term is used herein, although, through seeding techniques, the orientation of the silicon overlayer can be caused to be the same as that of the silicon wafer upon which the combination was formed.

One particular technique for forming a SOI heterostructure involves implantation of oxygen ions into a silicon substrate. See U.S. Pat. No. 3,855,009. After appropriate preparation of a major surface of a silicon wafer, oxygen ions are implanted into the wafer through the major surface. As is well known, such ions come to rest in a relatively narrow subsurface region of the matrix, with the mean depth of penetration (and thickness of the oxygen-rich layer) depending on the energy of the ions. The '009 patent teaches that, after heat treating of the implanted wafer at a temperature between 1000° and 1200° C. to anneal out damage in the Si overlayer and to cause formation of the $SiO_2$ layer from the implant, the thickness of the Si overlayer is increased by deposition of Si. Semiconductor devices can then be formed in the epitaxial silicon overlayer in a known manner.

The '009 patent also teaches that buried silicon carbide and silicon nitride layers can be formed in substantially the same manner, by implantation of, respectively, carbon or nitrogen ions. This prior art technique for forming a silicon heterostructure thus comprises implantation of relatively light ions into a silicon wafer, with the resulting buried silicon compound layer being non single crystal and nonepitaxial with the silicon matrix.

Recently some work has also been done that involves implantation of relatively heavy ions into silicon. See M. N. Kozicki et al, *Institute of Physics Conference Series,* No. 67, Section 3, pages 137–142 (1983). These authors report on the implantation of cobalt and chromium ions into polycrystalline silicon. The use of relatively high implantation energies (350 keV) resulted in the formation of a buried region of average composition of one metal atom to two silicon atoms. The implanted samples were subjected to a conventional furnace anneal (900°, 950°, or 1025° C.) or to an electron beam anneal. The technique did not result in the formation of a homogeneous epitaxial buried layer. F. H. Sanchez et al, *Proceedings of the Materials Research Society Symposium,* Vol. 51, pages 439–444, (1986) discloses implantation of Cr, Fe, Co, and Ni ions into single crystal silicon samples. No buried layer was formed.

The prior art thus does not know any implantation method that results in formation of a buried single crystal layer that is epitaxial with the matrix. Furthermore, silicide layers formed by the prior art implantation process typically have a relatively low conductivity, due to the presence of grain boundaries, line and point defects, and possibly two or more phases. The relatively low conductivity and high defect density make such prior art buried silicide layers unacceptable for applications such as metal base transistors, and at least reduce their usefulness as a conductor material in multilayer integrated devices. On the other hand, the prior art deposition method can be used to produce epitaxial layers of silicide or other materials on silicon, and to form epitaxial silicon thereon, resulting in formation of buried layers of epitaxial silicide or other materials. However, these deposition processes are slow, can only be successfully practiced under extremely clean high vacuum conditions (thus typically do not lend themselves readily to practice in a manufacturing environment), tend to result in structures with interfacial impurities, and lead to incorporation of substantially all of the impurities in the starting material into the silicide.

In view of the potential significance of articles such as semiconductor devices comprising buried, high quality epitaxial single crystal layers of metal silicides and possibly other materials, a method for forming such buried layers that can be practiced in a manufacturing environment with commonly available apparatus that has the potential of high throughput, that inherently leads to substantially impurity-free interfaces and to the elimination of impurities that are present in at least one of the starting materials, is of substantial interest. This application discloses such a method.

GLOSSARY AND DEFINITIONS

By "mesotaxy" we mean herein the process of direct formation of a substantially single crystal second material body (typically a thin layer) within a substantially single crystal first material matrix (with the first and second materials differing in their chemical composition), such that the second material body is epitaxial with the first material matrix. Mesotaxy is thus fundamentally different from epitaxy, which refers to the formation of a second material layer on a first material, with the layer being epitaxial with the substrate.

A "single crystal" or "monocrystalline" body herein is a body of crystalline material that has essentially the same crystalline orientation throughout the body. In agreement with current usage, a body is considered to be a single crystal body even though it may contain defects such as dislocations.

One crystalline body herein is "epitaxial" with another crystalline body in contact with the former if at least two crystal lattice directions are continuous across the interface between the two bodies.

By a "heterostructure" we mean herein a structure (typically a multilayer structure) that comprises a multiplicity of compositonally distinct regions (typically compositionally distinct layers).

A "heteroepitaxial" structure herein is a heterostructure in which at least one region is epitaxial with another, compositionally distinct, region. Typically, one layer is epitaxial with a chemically distinct contacting layer.

SUMMARY OF THE INVENTION

We describe here a new approach (to be referred to as "mesotaxy") to the formation of a heteroepitaxial structure that comprises a second material layer embedded in a first material matrix. It involves implantation of ions into a single crystal body and appropriate heat treatment of the implanted body.

Although the new method is described herein largely in terms of the formation of a buried metal silicide (primarily $CoSi_2$, $CrSi_2$, $TiSi_2$ and $NiSi_2$) layer in a silicon matrix, we expect that other semiconductors (e.g., Ge), and possible compound semiconductors such as III-V and II-VI semiconductor and even other classes of matrices (e.g., metals or insulators), and other atomic implantation species (e.g., Y or Mg into Si, and combinations of implantation species, e.g., Co and Ni) can be found that are thermodynamically and crystallographically suited for mesotaxy. Therefore, we present first a general description of the technique.

The inventive method comprises providing a single crystal body (exemplarily a semiconductor wafer) having a major surface, and implanting ions of at least one (frequently relatively heavy) chemical species at a predetermined mean depth below the major surface of the body, such that a buried layer that is relatively rich in the implanted species is formed. Subsequent to the implantation the implanted body is heat treated. The implantation and heat treatment conditions are chosen such that the buried species-rich layer is transformed into the second material layer. The second material is a substantially stoichiometric compound that differs from the first material and comprises the implanted species. The conditions are also chosen such that the resulting buried second material layer is substantially single crystal and epitaxial with the first material matrix. The second material layer and the first material/second material interfaces are substantially free of impurities.

The thus produced heterostructure can then be processed in any appropriate way to form an article, exemplarily an electronic, optical or optoelectronic device or devices. Processing techniques are well known in the art. See, for instance, D. J. Elliot, "Integrated Circuit Fabrication Technology," McGraw-Hill, 1982.

We know of no existing technologically sigificant process that meets the above description. However general the method may be, we currently consider its application to heteroepitaxial Si/metal silicide/Si structures to be especially significant since, inter alia, it can result in buried silicide layers of exceptionally high crystalline and/or electronic quality that offer promise for high quality device applications. Furthermore, we know of nothing in the prior art to suggest that mesotaxy might be possible, and we consider our discovery of mesotaxy to be indeed surprising.

DETAILED DESCRIPTION

A feature of the inventive technique is the implantation of (frequently relatively heavy) ions into a substrate body such that a buried layer rich in the implanted species is formed. Although the prior art knows an example of the high energy (350 keV) implantation of Co and Cr into polycrystalline Si such that a buried metal-rich layer was formed (see Kozicki et al, op. cit.), those skilled in the art generally expect that sputtering of the semiconductor target by the ions will impose a relatively low limit on the achievable concentration of the implanted species. See, for instance, Z. L. Liau et al, *Journal of Vacuum Science and Technology*, Vol. 15, pp. 1629–1635 (1978). Also, see FIG. 1 of Sanchez et al (op. cit.), which shows that a buried layer was not formed under the conditions of the implantation. However, we have shown that, despite the widespread expectation to the contrary, buried layers rich in a relatively heavy (atomic number > 8, typically > 20) element can indeed be formed by ion implantation using commercially available implanters.

A further and very significant feature of the inventive technique is a solid state reaction between the semiconductor and the implanted species under conditions that favor formation of the desired compound, and also favor formation of the compound as a buried single crystal epitaxial with the matrix in which it is embedded. This typically requires, inter alia, that the lattice structure and lattic constant of the semiconductor and of the compound be subsantially matched, with the lattice constants generally differing by less than about 5%.

Figure 1:
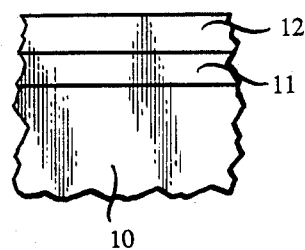
FIG. 1 is a schematic representation of an exemplary three-layer heteroepitaxial structure according to the invention.

FIG. 1 schematically represents an exemplary three-layer heterostructure according to the invention. It shows essentially single crystal lower and upper first material (e.g., semiconductor) layers 10 and 12, with an essentially single crystal compound layer 11 therebetween. As discussed above, 11 is epitaxial with both 10 and 12.

As will be readily appreciated by those skilled in the art, devices can be formed directly in a semiconductor overlayer 12, or 12 can form the substrate for the formation of one or more further layers. For instance, the thickness of 12 can be increased by a known method for the growth of an epitaxial semiconductor layer on a substrate of the same semiconductor, and subsequently, devices canbe formed in the top layer. See, for instance, the '009 patent. On the other hand, a heteroepitaxial layer of another semiconductor (e.g., GaAs) could be grown on, e.g., a Si layer 12 by a known technique, and devices formed in the top layer.

It will also be appreciated by those skilled in the art that a controlled dose of the ions can be implanted substantially uniformly into either all or a significant part of the major surface of a semiconductor substrate, or that the implantation can be localized such as to yield a patterned implant layer (possibly using different doses in different regions). In the latter case a patterned mask layer on the substrae or a programmable focused ion beam can be used to produce the patterned implant. Furthermore, since the implant depth is directly related to the ion energy, it is possible to create buried compound regions of varying distance from the surface. This ability may, for instance, be advantageously used to create a multilevel conductor arrangement in VLSI chips.

We now describe in detail a particular exemplary embodiment of the invention, namely, the formation by mesotaxy of a buried epitaxial layer of $CoSi_2$ in a Si matrix. As is well known, Co and Si form a number of compounds, $Co_2Si$, $CoSi$, $CoSi_2$, of which only the last has the requisite crystal structure and lattice constant to make epitaxy with Si possible. Thus, the implant conditions and the heat treatment have to be chosen such that $CoSi_2$ is formed. Other constraints will be discussed below.

Exemplarily, we used a 200 keV, ~20 $\mu A/cm^2$, scanned $^{59}Co^+$ beam. Both (100) and (111) orientation Si wafers were used as substrates. The major surface was prepared in a conventional manner, and the substrate typically was tightly clamped to a stainless steel block typically maintained at a temperature in the range 300°-500° C. However, some beam heating of the substrate cannot be ruled out.

After implantation, the sample is subjected to a heat treatment, as will be described in more detail below. Since the heat treatment causes essentially all of the implanted Co to contribute to the formation of the buried $CoSi_2$ layer, it is easy to determine the dose required to result in a given thickness of buried layer. For instance, a thickness of 0.1 $\mu m$ $CoSi_2$ requires implantation of approximately $2.5 \cdot 10^{17}/cm^2$ of Co.

Figure 2:
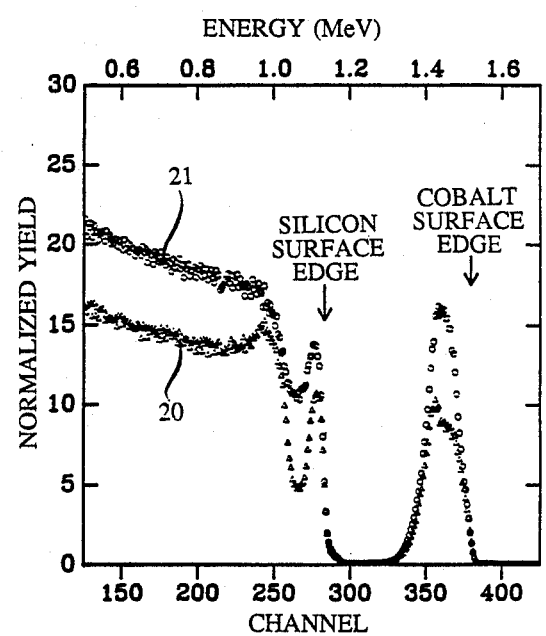
FIG. 2 shows as-implanted RBS yields for a Co-implanted Si matrix.

FIG. 2 shows Rutherford Backscattering Spectroscopy (RBS) yields for a random and a channeled (100) direction in an as-implanted (100) Si substrate, with 20 and 21 indicating the (100) channeled and random yields, respectively. Such RBS yields are a commonly accepted indicator of crystalline quality. The implant conditions were: substrate nominally at 350° C., 200 keV, $3 \cdot 10^{17}/cm^2$ Co. FIG. 2 shows that the implanted Co is buried beneath the Si surface, with the peak Co concentration of 27.5 atomic % appearing at a depth of about 115 nm. FIG. 2 also shows that the as-implanted Co-rich regio has some degree of crystalline order in registry with the Si matrix, ($\chi_{min}$ about 55%) but definitely is not device-grade material. $\chi_{min}$ is the minimum observed ratio of RBS yield in the channeling direction to that in the random direction, and is a standard measure of crystalline quality. A low temperatue anneal (1 hour at 600° C.) resulted in only slight changes in the RBS Co profile, indicating some redistribution of the Co with little improvement in crystallinity.

Figure 3:
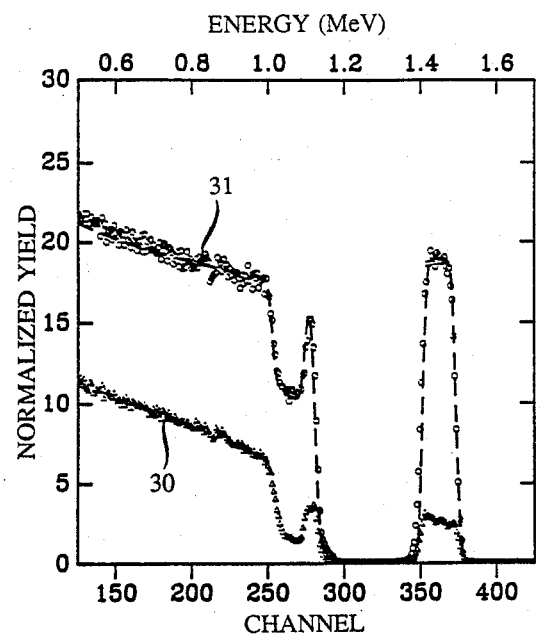
FIG. 3 shows RBS yields for the Co-implanted Si matrix after heat treatment.

A subsequent high temperature treatment (½ hour at 1000° C.), however, produced a dramatic transformation, as can be seen from FIG. 3, wherein 30 and 31 refer to the channeled and random yields, respectively. The Co profile has abrupt edges, the characteristic yield for stoichiometric $CoSi_2$, and a greatly reduced channeling yield (the latter being indicative of the high crystalline quality of the buried layer), e.g., $\chi_{min}$ about 12%.

FIG. 3 also indicates that the buried layer is epitaxial with the Si matrix, and that the crystalline quality of the top Si layer is substantially improved, as compared to the as-implanted condition. The dashed line 31 was obtained by computer simulation of the random RBS spectrum for a 110 nm layer of $CoSi_2$ sandwiched between a 60 nm top layer of Si and a Si bottom layer of effectively infinite thickness, and is in excellent agreement with the measured spectrum. Buried layers according to the invention typically have a $\chi_{min}$ substantially smaller (at least 50% smaller) than the as-implanted $\chi_{min}$ in the same sample.

In summary, FIGS. 2 and 3 show that under the indicated conditions, a heteroepitaxial structure (Si/$CoSi_2$/Si) of high crystalline quality can be produced by mesotaxy. Other experimental results agree with and amplify this conclusion. For instance, cross-section transmission electron microscopy also shows that the $CoSi_2$ region is single crystal material epitaxial with the matrix. High resolution transmission electron microscopy of the Si/$CoSi_2$ interfaces shows them to be abrupt, epitaxial, and essentially smooth. The relative smoothness of the interface in the (100) orientation is of particular interest, since $CoSi_2$ (and other silicides) cannot be grown without substantial faceting on (100) Si by other solid state methods. Since devices are most commonly fabricated on (100) Si, the presence of faceted interfaces in prior art Si/$CoSi_2$ heteroepitaxial structures is a considerable disadvantage. The inventive technique is essentially free of this shortcoming.

Another problem associated with prior art techniques is the difficulty of obtaining high purity buried layers and atomically clean interfaces. As will be appreciated by those skilled in the art, the presence of impurities results in higher resistivity and/or interface states which can negatively affect the operating chracteristics of devices formed in such material. This problem is not present in the inventive technique, since the implantation technique inherently results in removal of all but the wanted atomic species from the beam, and since the interfaces are never exposed.

RBS is not the only experimental technique to yield quantitative information on the quality of the buried layer. The resistance ratio (RR, defined as R(T=300° K.)/R(T=4.2° K.), where R is the resistivity and T the absolute temperature) of a buried conductive layer can be determined and is known to be a sensitive indicator of the structural integrity, crystalline defect density, interface roughness, chemical purity and deviations from stoichiometry of the layer, with a large value of the RR being indicative of high quality material. In buried metallic layers produced according to the invention the RR typically is substantially greater than 1, preferably >5. For instance, the RR of a $CoSi_2$ layer embedded in Si and produced by mesotaxy substantially as described above was found to be 15.48, which is almost a factor of 2 greater than that of the best prior art epitaxial $CoSi_2$ film.

Typically several process parameters have to be chosen properly in order to achieve mesotaxy. Among these parameters generally are the substrate temperature during implantation, the ion energy and dose, and the annealing temperature and time. Since the proper parameter values are expected to be, at least to some extent, dependent on the nature of the substrate and of the implant species, no generally valid parameter values can be given. However, based in part on our experience in the mesotaxy of $CoSi_2$ in Si, it appears that the substrate advantageously is maintained above room temperature (e.g., 300°–500° C. for Si) to avoid amorphization and/or to aid in the diffusion of the implanted species in the matrix. Furthermore, the ion energy has to be relatively high (e.g., above 100 keV) in order to form a buried layer and to avoid loss of the implanted species due to sputtering, and the ion dose has to be high enough such that stoichiometry can be attained by annealing. Still further, the annealing temperature has to be high enough such that compound formation as well as atomic rearrangement in the matrix can take place, yet be low enough such that degradation of the buried compound layer (manifested, for instance, by an increase in resistivity) is avoided. For instance, in the $Si/CoSi_2/Si$ system we found that annealing in the 600°–850° C. range generally results in some improvement of the quality of the buried layer (RR increases by about 3–4 from the as-implanted condition), but that annealing in the range 850°–1100° C. (preferably about 1000° C.) results in much greater improvement. Annealing above about 1100° C. resulted in deterioration of the quality of the buried layer. However, at least in some cases it may be advantageous to have a multi-step heat treatment, e.g., with a low temperature anneal followed by a high temperature anneal.

In mesotaxy the buried layer is protected at all times by the top semiconductor layer. As a consequence the annealing temperature can be higher than is possible in the prior art deposition method. This is a further advantage of the inventive technique, since higher annealing temperature typically results in improved quality of the buried layer as well as of the top semiconductor layer.

TABLE 1

| Orientation | Dose (ions/cm²) | SS Stage T | Annealing T/time | $\chi_{min}$ | RR |
|---|---|---|---|---|---|
| (100) | $2 \times 10^{17}$ | RT | as implanted | | |
| | | | +500° C., 1 hr | | 1.69 |
| | | | +600° C., 1 hr | | 2.70 |
| (100) | $3 \times 10^{17}$ | 350° C. | as implanted | 55% | 1.19 |
| | | | +600° C., 1 hr | 49% | 4.30 |
| | | | +1000° C., ½ hr | 12% | 15.48 |
| | | | +1200° C., ½ hr | 12% | 11.91 |
| (100) | $3 \times 10^{17}$ | 450° C. | as implanted | 50% | .84 |
| | | | +600° C., 1 hr | 29% | 5.03 |
| | | | +1000° C., ½ hr | 12% | 11.48 |
| | | | +1100° C., ½ hr | 12.7% | 10.75 |
| (111) | $3 \times 10^{17}$ | 350° C. | as implanted | 43% | 1.11 |
| | | | +600° C., 1 hr | 25% | 6.50 |
| | | | +1000° C., ½ hr | 7.8% | 6.50 |
| (111) | $3 \times 10^{17}$ | 450° C. | as implanted | 59% | 1.04 |
| | | | +600° C., 1 hr | 35% | 4.00 |
| | | | +1000° C., ½ hr | 6.9% | 7.82 |
| (111) | $2 \times 10^{17}$ | 450° C. | as implanted | 67% | 1.00 |
| | | | +600° C., 1 hr | 49% | 2.51 |
| | | | +1000° C., 1 hr | 6.4% | 5.37 |

Key to Table I: "S.S." stands for "stainless steel", "T" for "temperature", and "RT" for "room temperature".

Some of these results are exemplified by the data contained in Table 1, which pertains to the $Si/CoSi_2/Si$ system, with Co implantation at 200 keV. As can be seen from the data in Table 1, the detailed characteristics of the buried layer may depend on the substrate orientation. For instance, whereas the (100) orientation yielded buried layers having $\chi_{min}$ of about 12% and RR > 10, the (111) orientation yielded layers with $\chi_{min}$ of about 7% and RR ~ 7.

We would like to further illustrate the above points by citing conditions which we found not to result in successful growth of a buried $CoSi_2$ layer in Si. Implantation temperatures of 77° K., room temperature, and 260° C. all resulted in an amorphous Si surface and/or failure to form a buried Co-rich layer. Frequently, when annealing such low temperature implant samples at 1000° C., migration of the Co to the surface was also observed. Doses of $1 \cdot 10^{16}$, $5 \cdot 10^{16}$, and $1 \cdot 10^{17}/cm^2$ did not result in formation of a stoichiometric layer under the annealing conditions used by us.

Various device applications based on the basic structure depicted in FIG. 1 are contemplated. An exemplary schematic device structure is shown in FIG. 3 of the '009 patent and described in columns 4 and 5 of the patent. Mesotaxy may also be advantageously used in optical and optoelectronic devices.

Figure 4:
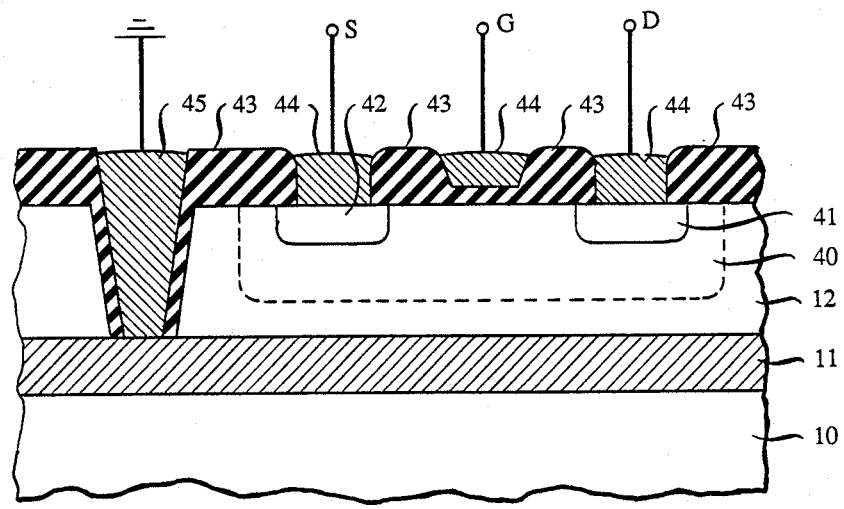
FIG. 4 schematically depicts an examplary device according to the invention.

Other contemplated device applications of mesotaxy include a MOSFET comprising a backside gate, and a MOSFET or other device comprising a buried ground plane. The latter application is schematically illustrated in FIG. 4, wherein regions 40, 41, and 42 exemplarily are p, p+ and p+ conductivity type, respectively, 43 refers to patterned oxide, 44 refers to metallization regions, and 45 is a metallized via hole whereby contact is made to the buried ground plane 11, formed by mesotaxy. Indicated are also means for making electrical contact to the source and drain regions and the gate.

By means of mesotaxy it may also be possible to form a semiconductor layer within another semiconductor (e.g., $CrSi_2$ within Si), the two semiconductors having different bandgaps. Such combinations, which previously have only been produced by MBE, are known to have interesting characteristics that make possible useful electronic devices such as heterojunction transistors. By means of a further implant (e.g., Co) a portion of the buried epitaxial semiconductor layer can be converted into a metal, opening up device design possibilities not previously available. Furthermore, more than one atomic species can be implanted into the same region. For instance, implantation of Co and Ni into Si is expected to result in formation of the epitaxial ternary silicide $Co_xNi_{1-x}Si_2$, which is known to have advantageous conductive characteristics.

EXAMPLE 1

A (100) oriented Si wafer, cleaned by means of a conventional technique, was attached in a commercially available ion implanter to a stainless steel block maintained at about 350° C., with this temperature considered to be the nominal implant temperature. A mass analyzed beam (200 keV, 40 μA, about 10 μA/cm²) of $^{59}Co^+$ from a Freeman ion source was directed 7° off normal at the Si wafer. The implanted dose was $3 \cdot 10^{17}/cm^2$. After completion of the implant the wafer was maintained in vacuum ($\sim 10^{-7}$ Torr) for about 1 hour at 600° C., followed by a 30 minute vacuum anneal at 1000° C. The thus produced heterostructure contains an approximately 100 nm thick buried single crystal $CoSi_2$ layer, with a 60 nm single crystal Si overlayer. The structure is heteroepitaxial, with the $CoSi_2$ layer having $\chi_{min} \sim 12\%$ and $RR \sim 15$, and the Si overlayer having $\chi_{min} \sim 15\%$.

EXAMPLE II

A $CoSi_2$ layer is formed by mesotaxy in a (111)-oriented Si wafer substantially as described in Example I, except that the nominal implant temperature is about 300° C., the ion energy is 400 keV, the implant dose is $5 \cdot 10^{17}/cm^2$, the thickness of the epitaxial $CoSi_2$ layer is about 170 nm, and that of the Si overlayer is about 130 nm.

EXAMPLE III

A $Co_{0.5}Ni_{0.5}Si_2$ layer is formed by mesotaxy in a (100) oriented Si wafer substantially as described in Example I, except that substantially equal numbers of Co and Ni ions are implanted sequentially. The resulting epitaxial tertiary silicide layer has high conductivity and is of good crystalline quality.

EXAMPLE IV

A buried epitaxial $CoSi_2$ layer is formed by mesotaxy substantially as described in Example I, except that the nominal implant temperature is about 500° C., the ion energy is about 1.5 MeV and the ion dose is about $7 \cdot 10^{17}/cm^2$. In the Si overlayer of the resulting heteroepitaxial structure MOS devices are produced by conventional techniques, including providing electrical contact to the buried $CoSi_2$ layer such that the buried layer serves as buried ground plane.

EXAMPLE V

A $Si/CoSi_2/Si$ heteroepitaxial structure is formed substantially as described in Example I. On the Si overlayer a 0.5 $\mu$m epitaxial layer of Si is grown by MBE.

EXAMPLE VI

A heteroepitaxial structure is formed substantially as in Example V, except that on the Si overlayer a 0.5 $\mu$m epitaxial layer of GaAs is grown by MBE.

EXAMPLE VII

A (100) oriented Ge wafer is cleaned by a conventional process and Co implanted therein substantially as described in Example I, except that the nominal implant temperature is 150° C., the ion energy is 300 keV, and the implanted wafer is annealed at 750° C. A buried epitaxial layer of $CoGe_2$ is thus formed.

As will be apparent to those skilled in the art, various modifications and extensions of this invention are possible. All modifications and extensions which basically rely on the teachings through which this invention has advanced the art are properly considered to be within the spirit and scope of this invention.

What is claimed is:

1. A method of manufacturing an article comprising a first material body and a second material layer embedded within the body, the method comprising
    (a) providing a single crystal first material body having a major surface;
    (b) implanting at least one chemical species into the first material body at a predetermined mean depth below the major surface of the body such that a buried species-rich layer results;
    (c) heat treating the implanted body such that the buried species-rich layer is transformed into the second material layer, the second material being a substantially stoichiometric compound different from the first material and comprising the implanted chemical species; and
    (d) completing the manufacture of the article;
Characterized in that
    (e) the process further comprises choosing the implant and heat treatment conditions such that the second material layer is an essentially continuous, substantially single crystal layer epitaxial with the first material body and is located at a substantially constant depth below the major surface of the body in which the second material layer is embedded.

2. The method of claim 1, wherein the first material body is a semiconductor body.

3. The method of claim 1, wherein during ion implantation the substrate has a nominal temperature above room temperature, and wherein the ions are implanted with an energy of at least about 100 keV.

4. The method of claim 2, wherein the semiconductor body is a silicon body, and wherein the chemical species is selected from the group consisting of Co, Ni, Cr, Ti, Y, and Mg.

5. The method of claim 2, wherein the article comprises an electronic device, and step (d) comprises providing means for making electrical contact with the second material layer.

6. The method of claim 2, wherein the semiconductor body is a Ge body, and wherein the chemical species is Co.

7. The method of claim 2, wherein step (d) comprises epitaxially depositing material on the major surface.

8. The method of claim 4, wherein during ion implantation the substrate has a nominal temperature in the range from about 300° C. to about 500° C., the ions are implanted with an energy of at least about 100 keV, and step (c) comprises heating the ion implanted substrate to a temperature in the range from about 800° C. to about 1100° C.

9. The method of claim 4, wherein the second material is a member of the group consisting of $CoSi_2$, $NiSi_2$, $CrSi_2$, $TiSi_2$ and $Co_xNi_{1-x}Si_2$, with $0<x<1$.

10. The method of claim 4, wherein the major surface is at least approximately a (100) surface.

11. The method of claim 7 wherein the semiconductor body is a Si body, and wherein the epitaxially deposited material is chosen from the group consisting of Si and GaAs.

* * * * *